United States Patent [19]

Hogg et al.

[11] 3,936,740

[45] Feb. 3, 1976

[54] METHOD AND APPARATUS FOR AUTOMATICALLY SAMPLING PULSES A PREDETERMINED AVERAGE NUMBER OF TIMES FOR STORAGE AND SUBSEQUENT REPRODUCTION

[75] Inventors: Walter R. Hogg, Miami Lakes; Wallace H. Coulter, Miami Springs, both of Fla.

[73] Assignee: Coulter Electronics, Inc., Hialeah, Fla.

[22] Filed: Feb. 13, 1974

[21] Appl. No.: 442,110

[52] U.S. Cl. .... 324/71 CP; 235/92 PC; 235/151.30; 307/221 D; 328/111; 328/115; 328/151
[51] Int. Cl.² .................... G01N 27/00; H03K 5/20
[58] Field of Search ............................ 328/111–113, 328/115–117, 150–151, 164; 307/235 R, 221 D; 324/71 CP; 235/92 PC, 151.3, 151.31

[56] References Cited

UNITED STATES PATENTS

| 3,312,894 | 4/1967 | Blake et al. | 328/151 |
| 3,493,874 | 2/1970 | Finkel et al. | 328/151 |
| 3,795,008 | 2/1974 | Kolsrud et al. | 307/235 R |

*Primary Examiner*—Stanley D. Miller, Jr.
*Attorney, Agent, or Firm*—Silverman & Cass, Ltd.

[57] ABSTRACT

An apparatus which includes circuitry for automatically sampling each pulse in a series of pulses a predetermined average number of times, sequentially storing the samples for a period of time, and reproducing the pulses from the samples, delayed in time.

A method of operation is encompassed within the invention as well as use of the above apparatus in a particle study device.

30 Claims, 4 Drawing Figures

METHOD AND APPARATUS FOR AUTOMATICALLY SAMPLING PULSES A PREDETERMINED AVERAGE NUMBER OF TIMES FOR STORAGE AND SUBSEQUENT REPRODUCTION

BACKGROUND OF THE INVENTION

Currently, in the electronics art, delay lines are employed for a number of functions. For example, delay lines can be employed in particle study apparatus of the Coulter type such as is described in U.S. Pat. No. 2,656,508. The delay line would be employed as a part of circuitry used to improve the Coulter type particle detector by correcting for counting errors. In such applications, the delay line must have an analog characteristic. That is, it must delay signals without altering them in any way. Furthermore, in many applications, the delays must be for an appreciable length of time. LC networks generally can be used to provide analog delays, however, LC networks become extremely complex, bulky and impractical to use when long delays are required.

Long delays of analog signals can be provided by use of charge transfer devices currently available. The signal to be delayed is sampled and the sample stored for a period of time in a charge transfer storage register. Enough samples of the signal are taken so that the signal can be recreated from the samples. Of course, the signal duration must be relatively fixed in order to determine the number and relative timing of the samples, and the number of storage locations. If these are not known, a great many samples must be taken at a high repetition rate, and a substantial number of storage elements provided to store the samples. This again will result in a product which will be unacceptable due to its size and/or cost.

Statistically it can be shown that in any relatively uniform signal waveform which does not have sudden inflections, only a certain number of samples of the signal need be taken in order to reproduce the signal waveform, no matter what the signal duration. If the duration of the signal to be delayed is known, then a minimum number of samples and storage areas would be necessary. If a number of signals in sequence are to be delayed and they have a somewhat similar duration, an average number of samples to be taken in a period of time and stored can be established. If, however, the signals to be delayed consist of a series or train of signals having similar duration, and due to some change, these are followed by a series or train of signals having a substantially different duration, longer or shorter, establishing a fixed number of samples in a period of time and a fixed number of storage locations may not allow the recreation of the original signal, delayed in time.

SUMMARY OF THE INVENTION

It is therefore an object of this invention to provide apparatus for delaying a signal, without alteration of the signal, for an appreciable period of time. Another object is to provide apparatus for sampling and storing signals in order to provide an appreciable delay, which automatically samples the signals a predetermined average number of times during the duration of the signals and stores the samples.

In practicing this invention, an apparatus is provided for automatically sampling each pulse in a series of pulses a predetermined average number of times, for sequentially storing the samples and for reproducing the pulses in the series from the stored samples, but delayed in time. The apparatus includes a pulse duration detector which is operative in response to the receipt of each pulse in the series to develop a threshold pulse which has a duration substantially equal to a predetermined portion of the duration of the correspondingly received pulse in the series. A voltage controlled oscillator is provided for developing first clock signals at a particular repetition rate. The repetition rate of the voltage controlled oscillator is variable in response to variation in an applied control signal. A shift register of the charge transfer device type is coupled to the voltage controlled oscillator and operative in response to the first clock signals to sample the pulses in the series of pulses coupled to the shift register and to sequentially store the samples. The samples are sequentially shifted through each stage of the shift register in response to the first clock pulses, thus delaying the pulses. The sample in the last stage of the shift register is ejected upon receipt of a succeeding first clock pulse. The samples, sequentially ejected from the last stage of the shift register, will produce the pulses, delayed in time.

In one embodiment a potentiometer provides the applied control signal. In another embodiment a logic circuit is coupled to the pulse detector and the voltage controlled oscillator. The logic circuit is operative in response to the number of first clock pulses coupled thereto during the presence of each threshold pulse to develop a gating signal which varies in accordance with the number of first clock pulses received. The control signal is developed in response to a comparison between the gating signal and a reference signal and varies in accordance with the difference between the gating signal and the reference signal.

Novel methods of performing the above noted function, as well as use of the apparatus in a particle study device are also contemplated as being within the boundaries of this invention.

DETAILED DESCRIPTION OF THE INVENTION

Figure 1:
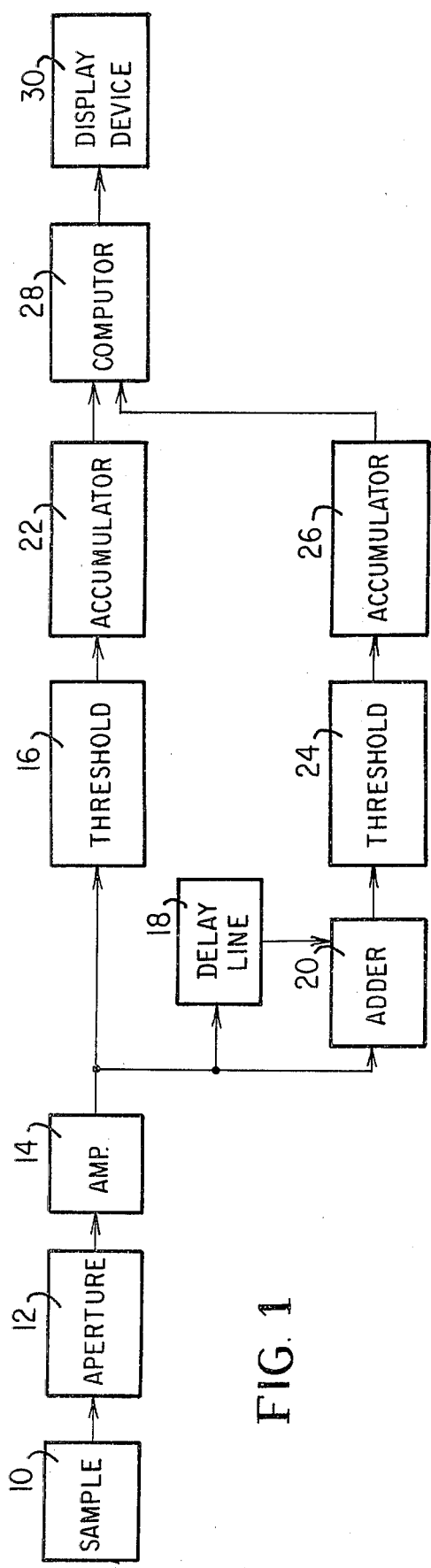
FIG. 1 is a block diagram of an apparatus for correcting coincidence count inaccuracies in a Coulter type of particle analyzer, which apparatus employs a delay line made in accordance with this invention.

Referring to FIG. 1, there is shown a Coulter type particle detector which corrects for coincidence count inaccuracies. Now well known in the art is the basic Coulter principle whereby a particle in an electrolyte is passed through an aperture. Electrodes positioned on each side of the aperture, and a source of supply coupled to the electrodes, establish a current in the electrolyte and through the aperture between the electrodes. This electric current is modulated by the passage of a particle through the aperture, due to the difference in electrical conductivity between the particle and the electrolyte. The modulated current creates a pulse which can be measured or counted.

Referring again to FIG. 1, a sample 10 containing particles to be detected and counted is coupled to aperture 12. Passage of the particles through aperture 12 creates a series of pulses to be detected and counted. Because of the size and configuration of aperture 12, the passage of particles in sample 10 through the aperture 12 can result in fewer pulses than particles passing through the aperture. This phenomenon is commonly termed coincidence error. The series of particle pulses developed by passage of the particles in sample 10 through aperture 12 can therefore be subject to coincidence error, and the relative amounts of this coincidence error are statistically ascertainable.

One way of correcting for coincidence errors is by developing two raw counts $N_1$ and $N_2$ of particle pulses for two samples where there is a known relationship between the two samples. It has also been determined that a single sample 10 passing through only one aperture 12 can provide both of the raw counts $N_1$ and $N_2$. To accomplish this, one of the raw counts, $N_2$, is created artificially from the same particle pulse train that generates the count $N_1$. By using the same particle pulses for both $N_1$ and $N_2$, there will be less random variation than would occur if other methods were used to generate the raw count $N_2$. Effectively, the counts $N_1$ and $N_2$ represent two known dilutions with the stronger dilution being synthesized from the weaker dilution.

The series of particle pulses developed by passage of the particles in sample 10 through aperture 12 are coupled to amplifier 14 where they are amplified and coupled to threshold circuit 16, delay line 18 and adder circuit 20. Threshold circuit 16 develops a pulse in response to each particle pulse coupled thereto which exceeds a predetermined amplitude and couples this pulse to accumulator 22. Each pulse coupled to accumulator 22 will be counted in order to yield the total number of accumulated pulses identified as $N_1$.

The series of particle pulses coupled to delay line 18 and adder circuit 20 are combined via the interconnection of delay line 18 and adder circuit 20 to produce the artificial pulse train at the output of adder circuit 20. The pulses in the artificially created pulse train are coupled from the output of adder circuit 20 to threshold circuit 24. Threshold circuit 24 develops a pulse in response to each artificially created pulse coupled thereto which exceeds a predetermined amplitude and couples this pulse to accumulator 26. Each pulse coupled to accumulator 26 will be counted to yield the total number of accumulated pulses identified as $N_2$. The raw counts $N_1$ and $N_2$, accumulated in accumulators 22 and 26 are then coupled to computer 28 where they are operated on in accordance with a mathematical formula to yield a true count $N_o$ which is corrected for errors due to coincidence. The true count may be displayed via a display device 30 coupled to computer 28.

In evaluating the operation of circuitry such as is shown in FIG. 1, it has been found that large delays should be provided by delay line 18 in order to yield the best accuracy in this type of coincidence correction circuit. In the preferred embodiment of the apparatus shown in FIG. 1, delays on the order of 300 microseconds in delay line 18 are considered most desirable under conditions where aperture 12 is approximately 100 microns in diameter. The use of LC networks in delay line 18 in order to provide such a delay, although possible, results in an expensive and bulky apparatus.

It should also be noted that it is desirable for the apparatus shown in FIG. 1 to operate using any size aperture 12 with a minimal or no adjustment on the part of the operator. When the size of aperture 12 is changed, the duration of pulses produced in response to passage of particles in sample 10 through aperture 12 also changes. This change in duration of the particle pulses can seriously affect the length of delay required by delay line 18, and the resulting circuit operation unless, of course, either the operator compensates the delay line for such changes in pulse duration or the compensation is made automatically.

Figure 2:
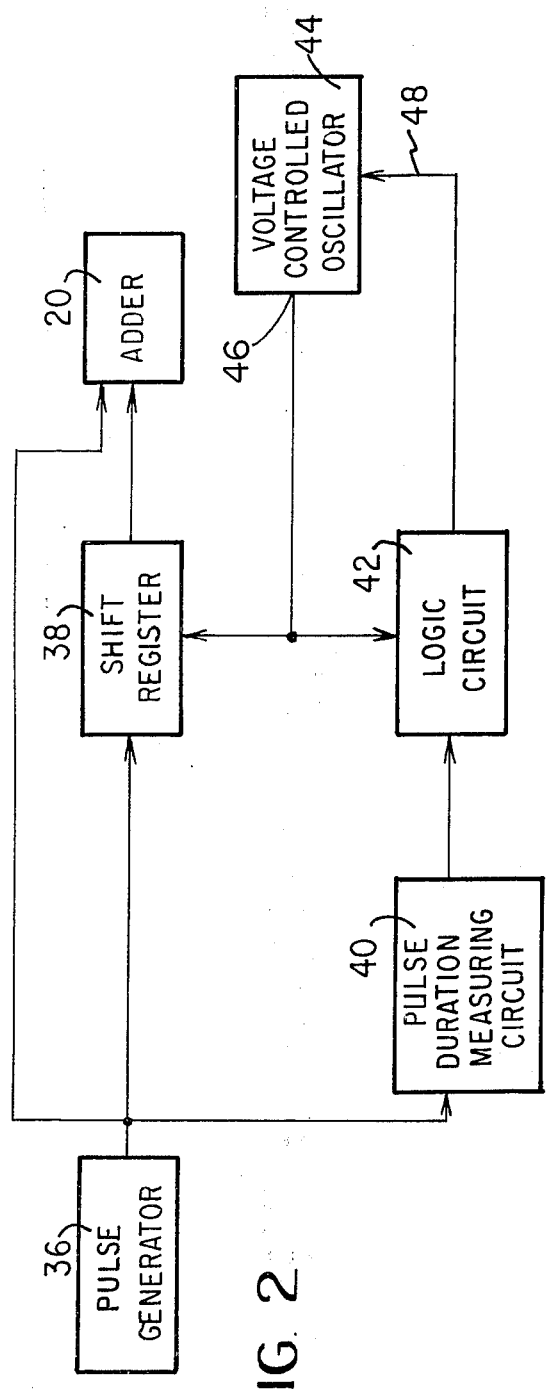
FIG. 2 is a simplified block diagram of an apparatus for automatically sampling pulses a predetermined average number of times, storing and delaying the pulses for reproduction of the pulses, delayed in time.

Referring to FIG. 2, there is shown a simplified block diagram of the delay line 18 shown in FIG. 1. Pulse generator 36 in FIG. 2 is shown in place of sample 10, aperture 12, and amplifier 14 in FIG. 1. Pulse generator 36 will generate a series of particle pulses in sequence and couple these particle pulses to shift register 38 and pulse duration measuring circuit 40.

In Coulter type particle analyzing devices such as shown in FIG. 1, the particle pulses produced have no well defined ends but have well defined middle portions. Pulse duration measuring circuit 40 will ascertain two points on the waveform of each particle pulse. These two points are generally on the leading and trailing edges of the waveform at, for instance, identical amplitudes on the waveform. Although points generally centered about the middle portion of the waveform have been selected in the past, points near the end of the waveform, which are still in well defined regions of the waveform can be selected. In the preferred embodiment, points should be selected which are as close to the end portions of the waveform as is possible in order to most closely approximate the duration of the waveform.

Pulse duration measuring circuit 40 develops a threshold pulse which has a duration corresponding to the period for which the particle pulse exceeds the amplitude of the first and second points noted above. The threshold pulse then has a duration corresponding to a predetermined portion of the duration of the correspondingly received particle pulse. The threshold pulse developed by pulse duration circuit 40 is coupled to one input of logic circuit 42. Circuits such as pulse duration circuit 40 are shown and described in U.S. Pat. Nos. 3,760,281, 3,701,029, 3,710,263, and 3,710,264.

Voltage controlled oscillator (VCO) 44 develops an output signal having a frequency or repetition rate which can be varied in accordance with an applied control signal or control voltage. For the purposes of the embodiment shown in FIG. 2, it will be assumed that the VCO 44 is a clock oscillator which develops pulses at its output 46. The pulses developed by VCO 44 are coupled to a control input of shift register 38 and to a second input of logic circuit 42.

Shift register 38 is a charge transfer type shift register which includes an input stage, an output stage and a plurality of stages sequentially connected between the input and output stages. Shift register 38 operates in response to each clock pulse developed by VCO 44 to sample a particle pulse in the series of particle pulses coupled to shift register 38. That is, it will sample the amplitude of the particle pulse and store the sampled amplitude in its first stage. The repetition rate of VCO 44 is selected such that approximately 20 samples will be taken during the period of a particle pulse. Each one of the samples will be sequentially stored in the first stage of shift register 38, and will sequentially shift through the succeeding stages of the shift register in response to each clock pulse from VCO 44. The samples in the last stage of shift register 38 are ejected from the stage in response to the succeeding clock and coupled to adder circuit 20. Because of the rate at which the samples of the particle pulse were taken, and because of the rate at which the samples are ejected from shift register 38, the samples coupled to adder circuit 20 will closely simulate the particle pulse coupled from pulse generator 36 to shift register 38. Moreover, because of the number of stages through which the approximately 20 samples making up a particle pulse are shifted, the particle pulse will have been delayed an appreciable period of time. Delays in the neighborhood of 300 microseconds can be supplied without an unreasonably great number of stages in shift register 38, and without unreasonably increasing the cost or size of the apparatus. If it is desired to couple a continuous particle pulse waveform to adder circuit 20, a filter network of the low pass type can be interposed between shift register 38 and adder circuit 20. The filter network would store energy so as to eliminate the voids between succeeding ejected samples, and additionally act to reduce any energy at the frequency of VCO 44 which could have mixed with the samples stored in shift register 38.

As previously noted, the clock pulses developed by VCO 44 are also coupled to logic circuit 42, in addition to the threshold pulses coupled from pulse duration measuring circuit 40. Logic circuit 42 will develop a gating signal or gating voltage in response to clock pulses received during each threshold pulse. This gating voltage will vary in accordance with the number of clock pulses received during the threshold pulse. The gating voltage will be compared to a reference voltage which is representative of 20 pulses being received by logic circuit 42 during a threshold pulse interval. If the reference voltage is greater than the gating voltage, thus indicating fewer received pulses, a control signal will be developed by logic circuit 42 and coupled to VCO 44 via conductor 48, causing VCO 44 to increase in repetition rate. If the gating voltage is greater than the reference voltage, the control signal developed and coupled to VCO 44 via conductor 48 will cause VCO 44 to decrease in repetition rate. The gating voltage is discharged or reset at the end of each threshold pulse in order to allow measurement of the number of clock pulses only during each threshold pulse. In this manner, VCO 44 can be adjusted over a period of time to provide a predetermined average number of clock pulses during each particle pulse.

It is to be understood that the above described circuitry will result in a predetermined average number of samples being taken during each particle pulse. Although large and/or rapid variations in the duration of particle pulses in a sequence can cause a substantial change in the number of samples taken for any one or more particle pulses in the series, this change is not serious since the absolute number of samplings per pulse is not critical. Furthermore, anomolous pulses generally have longer than average durations. Slow changes in the duration of particle pulses in the series, extending over a period of time, however, can be compensated for by the circuitry shown and described with reference to FIG. 2. Furthermore, should the aperture 12 in FIG. 1 be changed such that the pulse duration of the particle pulses is substantially changed, the circuitry shown in FIG. 2 automatically compensates for the changes in duration without any attention on the part of the operator. That is, the circuit will compare the number of samples taken during any pulse duration and adjust the number of samples taken in order to provide an average of approximately 20 samples per pulse duration.

Figure 3:
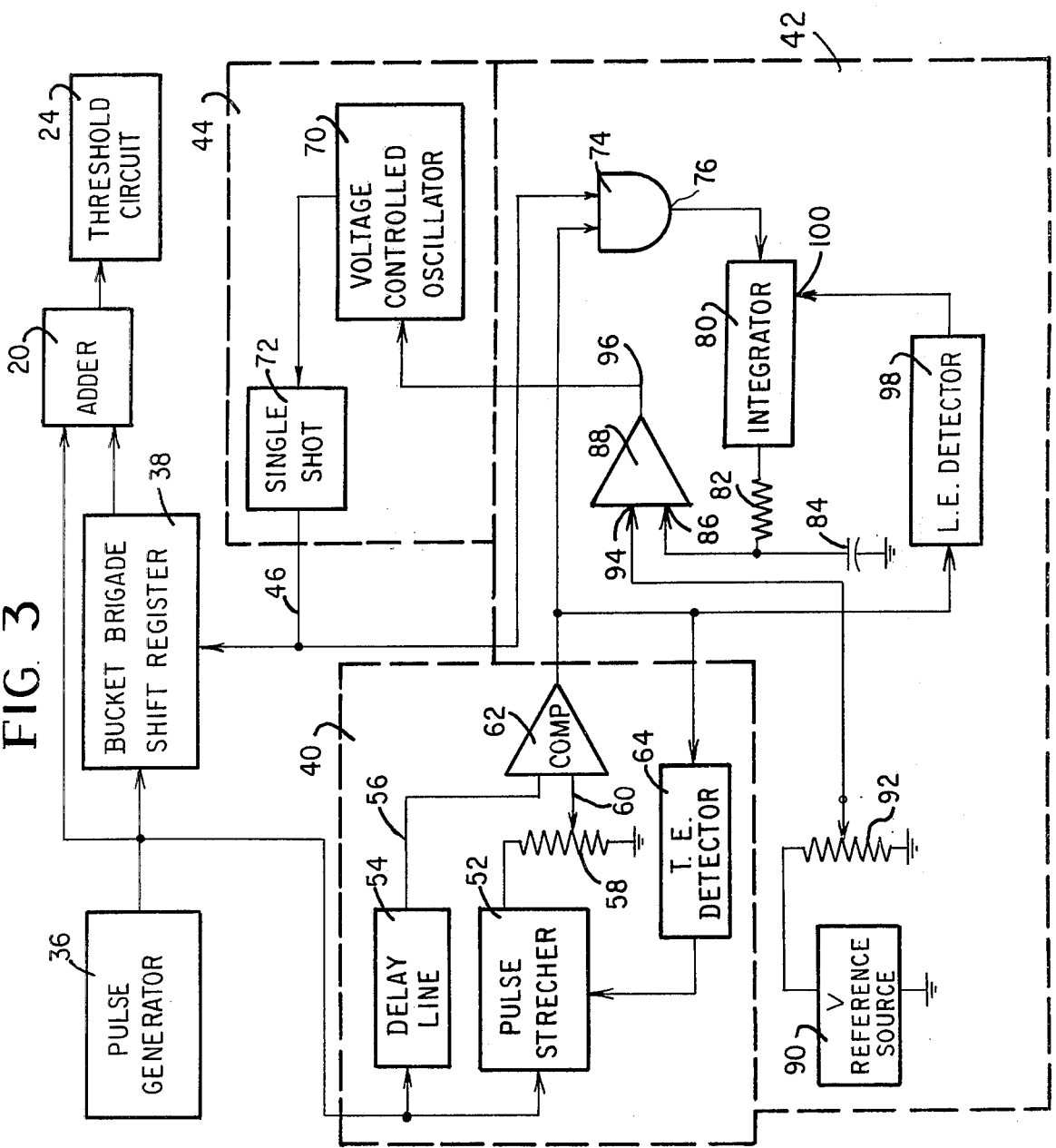
FIG. 3 is a more detailed block diagram of the apparatus shown in FIG. 2.

Referring to FIG. 3, a more detailed block diagram of the apparatus in FIG. 2, is shown. The series or train of particle pulses developed by pulse generator 36 is coupled to shift register 38, pulse duration measuring circuit 40 and adder circuit 20. Shift register 38 is a charge transfer type shift register which may include either charge coupled devices or bucket brigade devices; both well known in the art. In the preferred embodiment shift register 38 employs bucket brigade devices and will be hereinafter identified as a bucket brigade shift register. Bucket brigade shift register 38 operates in response to the clock pulses coupled from VCO 44 to sample the particle pulses coupled from pulse generator 36. The method of sampling and storing employed by bucket brigade shift register 38, and the method of ejecting pulses will not be described in detail as such a description has been provided above with reference to FIG. 2.

Figure 4:
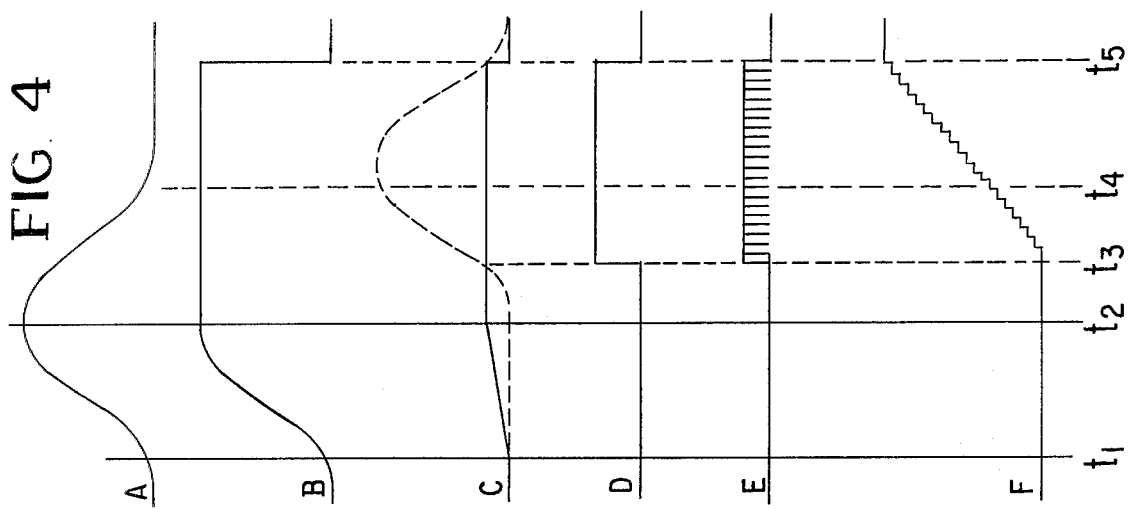
FIG. 4 shows waveform diagrams at a number of points in the block diagram of FIG. 3.

A particle pulse such as may be coupled to pulse duration measuring circuit 40 is shown in waveform A of FIG. 4. It is coupled to pulse duration measuring circuit 40 between the times $T_1$ and $T_4$; neither the beginning nor the end of the pulse being well defined as compared to the reference level or noise generated in the system. The pulse shown in waveform A of FIG. 4 is applied to a pulse stretcher 52 which produces the stretched pulse shown in waveform B of FIG. 4. The pulse stretcher may be a diode-capacity circuit which accepts the pulse and follows its leading edge to the maximum amplitude, but which does not subside with the pulse. It retains the maximum amplitude until the capacitors in the circuit are discharged. The stretched pulse shown in waveform B of FIG. 4 extends from the time $T_1$ to the time $T_5$ which will be discussed hereinafter.

The pulse shown in waveform A of FIG. 4 is also applied to an analog delay means which to the preferred embodiment is a delay line 54. Delay line 54 in the preferred embodiment seldom provides a delay of greater than 30 or 40 microseconds. This delay is small compared to a delay of for example 300 or 400 microseconds which must be supplied by shift register 38. The delayed waveform appears at conductor 56 and is shown as a broken line waveform in waveform C of FIG. 4. The same waveform C shows an attenuated wave which is the output of attenuator 58 appearing at conductor 60. The waveform shown in FIG. C by solid line is, of course, identical to the waveform B of FIG. 4, with the exception that it has been attenuated to approximately 1/6th the amplitude of the waveform B of FIG. 4. Assuming that there is some loss in delay line 54, this is taken into consideration in attenuating the stretched pulse shown in waveform C to give the exact fraction of the amplitude of the stretched pulse shown in FIG. B at conductor 60. In this case, the fraction is chosen to be approximately 1/6th the total amplitude of the pulse shown in waveform A, although it could be any desired fraction.

The two conductors 56 and 60 are inputs to a comparator 62 and this is indicated by superimposing the two wave shapes shown in waveform C of FIG. 4. Comparator 62 is connected such that it will produce an output only when the dashed line pulse, which is the delayed version of the pulse shown in waveform A, exceeds the attenuated stretched pulse shown in waveform C. This occurs between the times $T_3$ and $T_5$. It will be seen that the time $T_2$ marks the peak of the particle pulse shown in waveform A, and the location of the start of the horizontal part of the pulses shown in waveforms B and C, but it has no significance in the pulse duration measuring circuit. The output of comparator 62 consists of a duration measuring threshold pulse shown in waveform D of FIG. 4, coming between the times $T_3$ and $T_5$, and appearing at the output of comparator 62. When the pulse shown in waveform D of FIG. 4 terminates, a trailing edge detector 64, coupled between the output of comparator 62 and a reset input of pulse stretcher 52, will develop a pulse which is coupled to pulse stretcher 52. Pulse stretcher 52 will reset in response to the pulse from trailing edge detector 64.

VCO 44 includes a voltage controlled oscillator 70 of a clock pulse type as noted above. The output of oscillator 70 in VCO 44 is coupled to a monostable multivibrator 72, commonly known in the art as a single shot. Monostable 72 operates in response to each clock pulse from oscillator 70 to produce a pulse of short predetermined duration and amplitude. Monostable 72 is used to insure that the pulses developed by VCO 44 are short and of fixed duration. The output of monostable 72 in VCO 44 is coupled to the sample input of shift register 38 and to logic circuit 42 via conductor 46.

The threshold pulse developed by comparator 62 in pulse duration measuring circuit 40 is coupled to one input of AND gate 74 in logic circuit 42. The clock pulses from monostable 72 in VCO 44 are coupled to the second input of AND gate 74 in logic circuit 42. AND gate circuit 74 operates such that a logical 1 must be present at both inputs in order to produce a logical 1 at its output. AND gate circuit 74 will therefore produce a 1 at its output 76 in response to each clock pulse coupled thereto during the presence of a threshold pulse. A representation of the logical 1's developed during the presence of a threshold pulse is shown in waveform E of FIG. 4. The 1's developed by AND gate 74 are shown occurring only between times $T_3$ and $T_5$, the time during which the threshold pulse shown in waveform D is present. The logical 1's developed at output 76 of AND gate 74 are coupled to integrator 80. Integrator 80 will develop a voltage which increases in response to each 1 received, thereby effectively counting the number of received AND gate signals of 1's received from AND gate 74. The voltage developed by integrator 80 will therefore vary in accordance with the number of AND gate pulses received from AND gate 74. A representation of the voltage developed by integrator 80 is shown in waveform F of FIG. 4 for the period between $T_3$ and $T_5$. The voltage developed by integrator 80 is coupled through resistor 82 to one input of comparator 88. Resistor 82 and capacitor 84 coupled between resistor 82 and ground potential, constitute a low pass filter which filters out all but the DC component of the voltage developed by integrator 80. A reference source 90, suitably adjusted via potentiometer 92 to represent twenty clock pulses during a threshold pulse, is coupled to the second input 94 of comparator 88. Comparator 88 compares the voltage at input 86 with the voltage at input 94 and develops a control signal or control voltage at output 96 which varies in accordance with the difference between the voltage at input 86 and input 94. This control voltage is coupled to the control input of oscillator 70 in VCO 44 in order to adjust the frequency and repetition rate of VCO 44 for maintaining the predetermined average number of samples taken by shift register 38. A leading edge detector 98 is coupled to the output of comparator 62 in pulse duration measuring circuit 40. Leading edge detector 98 will develop a pulse in response to the leading edge of each threshold pulse developed by comparator 62. The pulse developed by leading edge detector 98 is coupled to the reset input 100, resetting the integrator 80 and discharging the voltage established therein during the preceding threshold pulse in response to the number of clock pulses counted during the preceding threshold pulse.

In operation then, the greater the number of clock pulses occurring during a particular threshold pulse, the higher the voltage developed by integrator 80. If the voltage at input 86 of comparator 88 exceeds the voltage at input 94, in response to the high number of pulses, the voltage developed at output 96 of comparator 88 will be negative and have an amplitude proportional to the difference between the voltage at input 86 and 94 of comparator 88. The negative voltage will cause oscillator 70 in VCO 44 to decrease in frequency or repetition rate so as to generate clock pulses at the repetition rate which allows the taking of a predetermined average number of 20 samples during a threshold pulse and therefore during a particle pulse. Should the number of clock pulses developed by oscillator 70 in VCO 44 be low, integrator 80 will develop a low voltage which is coupled to input 86 of comparator 88. If the voltage at input 94 of comparator 88 is greater than the voltage at input 86, indicating that too few pulses have occurred during the threshold pulse duration, a positive voltage will be developed at the output of comparator 88 and coupled to oscillator 70 in VCO 44. This positive voltage, which is proportional in amplitude to the difference between the voltages at inputs 86 and 94 of comparator 88, will cause oscillator 70 to increase in frequency. The increased frequency will allow shift register 38 to sample the particle pulses the desired average number of times.

Considerable variation may be made in structures constructed according to the teachings of the invention without departing from the spirit or scope thereof as defined in the appended claims. It is to be understood that although the above apparatus is automatic, manual and semiautomatic versions are envisioned as being within the scope of this patent. For example, the pulse duration measuring circuit 40 and logic circuit 42 can be omitted and replaced by a potentiometer coupled to VCO 44 via conductor 48. The potentiometer can include a control knob and dial, and can be calibrated to allow the operator to adjust the applied control signal in accordance with such factors as aperture size, system pressure and electrolyte viscosity; all of these, of course, determining average pulse duration.

What it is desired to be secured by letters patent of the United States is:

1. A method for automatically sampling each pulse in a series of pulses a predetermined average number of times, for sequentially storing the samples, and for reproducing each pulse in the series, delayed in time, including the steps of:
- detecting the duration of at least a portion of each pulse in the series,
- developing first signals having a variable repetition rate,
- varying the repetition rate of the first signals for developing a predetermined average number of first signals during said detected duration of each pulse,
- sampling each pulse in the series in response to said first signals,
- storing said samples for a period of time in response to said first signals.

2. The method of claim 1 wherein said samples are stored in a shift register and including the steps of:
- storing said samples in said shift register in response to said first signals,
- shifting the contents of each stage of said shift register to a succeeding stage in response to each of said first signals.

3. The method of claim 1 wherein said step of varying the repetition rate of said first signals includes the steps of:
- counting the number of first pulses developed during said portion of each pulse,
- comparing said counted number to a predetermined number, and
- developing a control signal for varying said repetition rate, said control signal varying in accordance with the difference between said counted number and said predetermined number.

4. The method of claim 1 wherein said step of varying the repetition of said first signals includes the steps of:
- developing a voltage signal in accordance with the number of first pulses developed during said portion of each pulse,
- comparing said voltage signal to a reference voltage, and
- developing a control signal for varying said repetition rate, said control signal varying in accordance with the difference between said voltage signal and said reference signal.

5. The method of claim 4 further including the step of discharging said voltage signal before said portion of each succeeding pulse.

6. An apparatus for automatically sampling each pulse in a series of pulses a predetermined average number of times, for sequentially storing the samples, and for reproducing each pulse in the series, delayed in time, said apparatus including in combination:
- pulse detection means operative in response to receipt of each pulse in the series to develop a threshold pulse, each threshold pulse having a duration substantially equal to a predetermined portion of the duration of the corresponding received pulse in the series,
- signal generation means for developing first signals at a particular repetition rate, said signal generation means being operative in response to a control signal coupled thereto to vary said repetition rate,
- sample and storage means coupled to said signal generation means and operative in response to said first signals to sample the pulses in the series coupled thereto and sequentially store the samples, and to reproduce the pulses in the series from said sequentially stored samples, delayed in time, and
- logic circuit means coupled to said pulse detection means and said signal generation means for receiving said first pulses and said threshold pulses and developing said control signal, said control signal varying in accordance with the number of first signals coupled to said logic circuit means during the presence of each threshold pulse coupled to said logic circuit means.

7. The apparatus of claim 6 wherein said sample and storage means includes a first and last storage stage and a plurality of stages sequentially coupled therebetween, said first stage being operative in response to said first signals to sample the pulse in the series coupled thereto and store said sample therein, said stages being further operative in response to said first signals to shift samples in each of said stages to the succeeding sequentially coupled stage with said last stage being operative to eject said sample stored therein from said sample and storage means whereby said sequentially ejected samples reproduce each pulse in the series, delayed in time.

8. The apparatus of claim 7 wherein said sample and storage means plurality of stages forms an analog shift register.

9. The apparatus of claim 8 wherein said analog shift register is a charge transfer device shift register.

10. The apparatus of claim 9 wherein said charge transfer device shift register is a charge coupled device shift register.

11. The apparatus of claim 9 wherein said charge transfer device shift register is a bucket brigade shift register.

12. The apparatus of claim 6 wherein said signal generation means is an oscillator for developing said first signals at said particular repetition rate, said oscillator being operative in response to said control signals to vary said repetition rate.

13. The apparatus of claim 12 wherein said oscillator is a voltage controlled oscillator.

14. The apparatus of claim 13 wherein said voltage controlled oscillator is a voltage controlled clock oscillator, and said first signals are clock pulses.

15. The apparatus of claim 6 wherein said logic circuit means includes:
- gate circuit means coupled to said signal generation means and said pulse detection means, said gate circuit means being operative during the presence of each threshold pulse coupled thereto to develop a gate signal in response to receipt of said first signals coupled thereto, said gate signal varying in accordance with the member of first signals coupled thereto, and
- comparison circuit means coupled to said gate circuit means and operative to compare said gate signal with a reference signal and develop said control signal, said control signal varying in accordance with the difference between said gate signal and said reference signal.

16. The apparatus of claim 15 wherein said gate circuit means includes:
- AND gate means coupled to said signal generation means and said pulse detection means, said AND gate means being operative during the presence of each threshold pulse coupled thereto to develop an AND gate signal in response to receipt of each first signal coupled thereto, and
- integrator means coupled to said AND gate means and operative to develop said gate signal in response to said AND gate signals.

17. The apparatus of claim 16 wherein said logic circuit means includes reset circuit means coupled to said integrator means and said pulse detection means and operative upon initiation of each threshold pulse to reset said integrator means and reduce said gate signal to a reference level.

18. The apparatus of claim 6 wherein each pulse in said series of pulses has no well defined ends but has a well defined middle portion, and wherein said pulse detection means includes first electrical circuit means for ascertaining two points on the waveform of each pulse in the middle portion of the waveform, said points being geometrically defined and spaced apart timewise, second electrical circuit means for measuring the duration of the segment of each pulse designed between said ascertainable points and for producing a threshold pulse for each pulse, the duration of each threshold pulse being that of said pulse segment and the amplitude thereof being the same for all threshold duration pulses.

19. The apparatus of claim 18 wherein said first electrical circuit means is operable to ascertain two points having the same amplitude on the particular pulse waveform, one point being on the leading edge of the pulse waveform and one point being on the trailing edge of the pulse waveform.

20. The apparatus of claim 18 wherein said two ascertainable points are at the same instantaneous amplitude value on the respective leading and trailing edges of each pulse, the value at each of the ascertainable points on each pulse waveform being a predetermined factional value of the maximum amplitude of that pulse.

21. The apparatus of claim 20 wherein said first electrical circuit means includes a delay circuit for delaying each pulse, a stretching circuit for stretching each pulse at the maximum amplitude of the pulse, an attenuating circuit for attenuating the stretched pulse to some fractional value of the maximum amplitude of the pulse, and circuit means for comparing the delayed pulse with the stretched and attenuated pulse, for generating said threshold pulse when the instantaneous value of the leading edge of the delayed pulse exceeds the amplitude of the stretched and attenuated pulse, and for terminating the threshold pulse when the instantaneous value of the trailing edge of the delayed pulse falls below the amplitude of the stretched and attenuated pulse.

22. In a particle study device which develops particle pulses in response to detection of particles and counts said particle pulses, and which includes error correction circuitry for providing a particle count of particle pulses corrected for detection and counting errors, the improvement comprising, delay circuit means for automatically sampling each particle pulse a predetermined average number of times, for sequentially storing the samples, and for reproducing each pulse from said samples delayed in time.

23. The apparatus of claim 22 wherein said delay circuit means includes,
control circuit means operative to develop first signals at a variable repetition rate, said control circuit means being further operative to vary said repetition rate in accordance with the duration of each particle pulse coupled thereto for developing a predetermined average number of said first signals during each of said particle pulses, and
sample and storage means coupled to said control circuit means and operative in response to said first signals to sample said particle pulses coupled thereto for sequentially storing the samples and for reproducing the particle pulses from said stored samples, delayed in time.

24. The apparatus of claim 23 wherein said sample and storage means includes a first and last storage stage and a plurality of storage stages sequentially coupled therebetween, said first stage being operative in response to said first signals to sample the particle pulses coupled thereto and store said sample therein, said stages being further operative in response to said first signals to shift samples in each of said stages to the succeeding sequentially coupled stage with said last stage being operative to eject said sample stored therein whereby said sequentially ejected samples reproduce each particle pulse in the series, delayed in time.

25. The apparatus of claim 24 wherein said sample and storage means having a plurality of storage stages is an analog shift register.

26. The apparatus of claim 23 wherein said control circuit means includes,
pulse detection means operative in response to receipt of each particle pulse to develop a threshold pulse, each threshold pulse having a duration substantially equal to a predetermined portion of the duration of the corresponding received particle pulse,
signal generation means for developing first signals at a particular repetition rate, said signal generation means being operative in response to a control signal coupled thereto to vary said repetition rate, and
logic circuit means coupled to said pulse detection means and said signal generation means for receiving said first pulses and said threshold pulses and developing said control signal, said control signal varying in accordance with the number of first signals coupled to said logic circuit means during the presence of each threshold pulse coupled to said logic circuit means.

27. The apparatus of claim 26 wherein said signal generation means is a voltage controlled oscillator.

28. The apparatus of claim 26 wherein said logic circuit means includes
gate circuit means coupled to said signal generation means and said pulse detection means, said gate circuit means being operative during the presence of each threshold pulse coupled thereto to develop a gate signal in response to receipt of said first signals coupled thereto, said gate signal varying in accordance with a number of first signals coupled thereto, and
comparison circuit means coupled to said gate circuit means and operative to compare said gate signal with a reference signal and develop said control signal, said control signal varying in accordance with the difference between said gate signal and said reference signal.

29. The apparatus of claim 22 wherein said delay circuit means includes,
signal generation means for developing first signals at a particular rate, said signal generation means being operative in response to a control signal coupled thereto to vary said repetition rate, and
sample and storage means coupled to said control circuit means and operative in response to said first signals to sample each particle pulse coupled thereto a predetermined average number of times, to sequentially store the samples, and to reproduce each particle pulse from said sequentially stored samples, delayed in time.

30. The apparatus of claim 29 further including potentiometer means for developing said variable control signal, said potentiometer means being coupled to said signal generation means for coupling said control signal thereto, said potentiometer being variable for selecting said control signal in accordance with the average duration of particle pulses.

* * * * *